(12) United States Patent
Shih et al.

(10) Patent No.: US 9,058,971 B2
(45) Date of Patent: Jun. 16, 2015

(54) ELECTRO-OPTICAL MODULE

(71) Applicant: Siliconware Precision Industries Co., Ltd., Taichung (TW)

(72) Inventors: Chih-Yuan Shih, Taichung Hsien (TW); Shih-Liang Peng, Taichung Hsien (TW); Jung-Pin Huang, Taichung Hsien (TW); Chin-Yu Ku, Taichung Hsien (TW); Hsien-Wen Chen, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 19 days.

(21) Appl. No.: 13/905,703

(22) Filed: May 30, 2013

(65) Prior Publication Data

US 2014/0192832 A1 Jul. 10, 2014

(30) Foreign Application Priority Data

Jan. 4, 2013 (TW) .............................. 102100202 A

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |
| *H01L 25/00* | (2006.01) |
| *H01S 5/022* | (2006.01) |
| *H01S 5/024* | (2006.01) |
| *H01S 5/062* | (2006.01) |
| *H01S 5/42* | (2006.01) |

(52) U.S. Cl.
CPC ............ *H01L 25/00* (2013.01); *H01S 5/02252* (2013.01); *H01S 5/0226* (2013.01); *H01S 5/02276* (2013.01); *H01S 5/02288* (2013.01); *H01S 5/02469* (2013.01); *H01S 5/06226* (2013.01); *H01S 5/423* (2013.01); *H01L 2224/48091* (2013.01)

(58) Field of Classification Search
USPC ................. 257/81, 82, 91, 99, 100, 116, 117, 257/432–437, E33.001–E33.077, E33.054, 257/E25.028, E25.032, 13, 40, 79–103, 257/918, E51.018–E51.022, 460, 72; 438/22–47, 69, 493, 503, 507, 956
See application file for complete search history.

(56) References Cited

U.S. PATENT DOCUMENTS

| | | | |
|---|---|---|---|
| 6,664,131 B2 * | 12/2003 | Jackson ........................ | 438/108 |
| 2004/0218372 A1 * | 11/2004 | Hamasaki et al. ............ | 361/767 |

(Continued)

*Primary Examiner* — Dao H Nguyen
*Assistant Examiner* — Tram H Nguyen
(74) *Attorney, Agent, or Firm* — Mintz Levin Cohn Ferris Glovsky and Popeo, P.C.; Peter F. Corless; Steven M. Jensen

(57) ABSTRACT

An electro-optical module is provided, which includes: a substrate having a first surface with a groove and an opposite second surface; a plurality of support members disposed on the first surface of the substrate; at least an electro-optical element having opposite active and non-active surfaces and disposed in the groove of the substrate via the non-active surface thereof; an interposer disposed on the first surface of the substrate and the electro-optical element for electrically connecting the electro-optical element to the substrate, wherein the interposer has a through hole corresponding in position to the active surface of the electro-optical element; and a transparent plate disposed over the first surface of the substrate and the interposer through the support members and having a lens portion corresponding in position to the through hole of the interposer, thereby reducing signal losses, improving alignment precision, and achieving preferred thermal dissipation and EMI shielding effects.

23 Claims, 4 Drawing Sheets

(56) References Cited

U.S. PATENT DOCUMENTS

| | | | |
|---|---|---|---|
| 2007/0200133 A1* | 8/2007 | Hashimoto et al. | 257/100 |
| 2010/0295070 A1* | 11/2010 | Su et al. | 257/91 |
| 2011/0037082 A1* | 2/2011 | Doan et al. | 257/89 |
| 2011/0180822 A1* | 7/2011 | Ruhnau et al. | 257/88 |
| 2012/0104524 A1* | 5/2012 | Takeshita et al. | 257/432 |
| 2012/0241795 A1* | 9/2012 | Chang et al. | 257/98 |

* cited by examiner

ELECTRO-OPTICAL MODULE

CROSS-REFERENCES TO RELATED APPLICATIONS

This application claims under 35 U.S.C. §119(a) the benefit of Taiwanese Application No. 102100202, filed Jan. 4, 2013, the entire contents of which is incorporated herein by reference.

BACKGROUND OF THE INVENTION

1. Field of the Invention

The present invention relates to anti-electromagnetic interference (anti-EMI) electro-optical modules, and more particularly, to an electro-optical module in which an electro-optical element is electrically connected to an interposer in a flip-chip manner to reduce the size of the electro-optical module.

2. Description of Related Art

Along with the development of semiconductor fabrication technologies, a chip can be integrated with not only electronic elements but also biological, electro-optical, mechanical, electrical or magnetic elements. For example, a laser diode chip is integrated with both electro-optical and electrical functions. There are three types of laser diodes: fabry-perot (FP) laser diodes, distributed feedback (DFB) laser diodes and vertical cavity surface emitting laser (VCSEL) diodes. Since VCSEL diodes are either of a surface emission type or of an edge emission type and can be fabricated with high precision and hence are easier to control than the FP and DFB laser diodes, the VCSEL diodes have become the first choice of the development of electro-optical modules.

Further, the VCSEL diodes generally have an active surface and a plurality of bonding pads at the same side. Therefore, for an electro-optical module having a VCSEL diode, the VCSEL diode is usually electrically connected to a substrate through wire bonding.

FIG. 1 is a schematic cross-sectional view of a conventional electro-optical module 1. Referring to FIG. 1, the electro-optical module 1 has: a substrate 10; a laser diode 111 and a photo diode 112 disposed on the substrate 10 for emitting and receiving light, respectively, wherein the laser diode 111 has an active surface 111a and a plurality of electrode pads 111b, and the photo diode 112 has an active surface 112a and a plurality of electrode pads 112b; a drive/electronic circuit controller (not shown); a plurality of support members 12 disposed on the substrate 10; and a transparent plate 14 disposed on the support members 12 and having lens portions 141, 140 respectively corresponding in position to the active surfaces 111a, 112a. Further, the electrode pads 111b of the laser diode 111 and the electrode pads 112b of the photo diode 112 are electrically connected to the substrate 10 through a plurality of bonding wires 110. However, such a wire bonding method can easily result in signal losses and electromagnetic interferences during high frequency signal transmission.

Therefore, there is a need to provide an electro-optical module to overcome the above-described disadvantages.

SUMMARY OF THE INVENTION

In view of the above-described disadvantages, the present invention provides an electro-optical module, which comprises: a substrate having a first surface with a groove and a second surface opposite the first surface; a plurality of support members disposed on the first surface of the substrate; at least an electro-optical element having opposite active and non-active surfaces and disposed in the groove of the substrate via the non-active surface thereof; an interposer disposed on the first surface of the substrate and the electro-optical element for electrically connecting the electro-optical element to the substrate, wherein the interposer has a through hole corresponding in position to the active surface of the electro-optical element; and a transparent plate disposed over the first surface of the substrate and the interposer through the support members and having a lens portion corresponding in position to the through hole of the interposer.

In the above-described module, the support members can be located at an outer periphery of the groove.

The above-described module can further comprise a thermally conductive adhesive layer formed in the groove for fixing the electro-optical element in the groove of the substrate.

In the above-described module, the electro-optical element can be a light-emitting element or a photo detecting element.

The above-described module can further comprise a semiconductor chip disposed in the groove of the substrate and electrically connected to the interposer.

The above-described module can further comprise a microcontroller disposed on the first surface of the substrate.

In the above-described module, the support members can be made of a metal.

In the above-described module, a plurality of thermally conductive through holes can be formed in the groove penetrating the substrate so as to expose portions of the thermally conductive adhesive layer.

In an embodiment, the interposer has opposite third and fourth surfaces. The fourth surface faces the first surface of the substrate and a metal layer is formed on the third surface of the interposer.

In an embodiment, a metal layer, an insulating layer and an electrical trace layer are sequentially formed on the fourth surface of the interposer.

In an embodiment, a soft material layer is formed on the third surface of the interposer. The soft material layer can be made of polyimide (PI), benzocyclobutene (BCB) or polybenzoxazole (PBO).

The present invention provides another electro-optical module, which comprises: a substrate having opposite first and second surfaces and a cavity penetrating the first and second surfaces; a heat sink having opposite top and bottom surfaces and disposed in the cavity in a manner that the bottom surface of the heat sink is exposed from the second surface of the substrate; a plurality of support members disposed on the first surface of the substrate; at least an electro-optical element having opposite active and non-active surfaces and disposed on the top surface of the heat sink via the non-active surface thereof; an interposer disposed on the first surface of the substrate and the electro-optical element for electrically connecting the electro-optical element to the substrate, wherein the interposer has a through hole corresponding in position to the active surface of the electro-optical element; and a transparent plate disposed over the first surface of the substrate and the interposer through the support members and having a lens portion corresponding in position to the through hole of the interposer.

In the above-described module, the support members can be located at an outer periphery of the groove.

According to the present invention, the electro-optical element and the substrate are electrically connected through the interposer, and the through hole of the interposer corresponding in position to the lens portion and the active surface of the interposer allows light beams collected by the lens portion to pass through so as to be received by the active surface of the electro-optical element.

By electrically connecting the electro-optical element to the interposer in a flip-chip manner and further electrically connecting the electro-optical element to the substrate through the interposer, the invention reduces the size of the electro-optical module, dispenses with the conventional bonding wires that are limited in loop length and height, and reduces the signal transmission distance. Therefore, the invention reduces signal losses during high frequency signal transmission. As such, the electro-optical module is applicable to high frequency signal transmission.

Further, by fixing the transparent plate to the substrate through the support members, the invention improves the accuracy of alignment between the lens portion of the transparent plate and the electro-optical element on the substrate. Furthermore, the support members made of metal provide an EMI shielding effect so as to improve the quality of high frequency communication.

Moreover, by embedding a heat sink in the substrate and disposing the electro-optical element and the semiconductor element on the heat sink, the invention achieves a preferred thermal dissipation effect.

Therefore, the invention overcomes the conventional disadvantage of signal losses caused by wire bonding, improves the accuracy of alignment, and achieves preferred EMI shielding and heat dissipating effects.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "top", "bottom", "first", "second" etc. are merely for illustrative purposes and should not be construed to limit the scope of the present invention.

Figure 1:
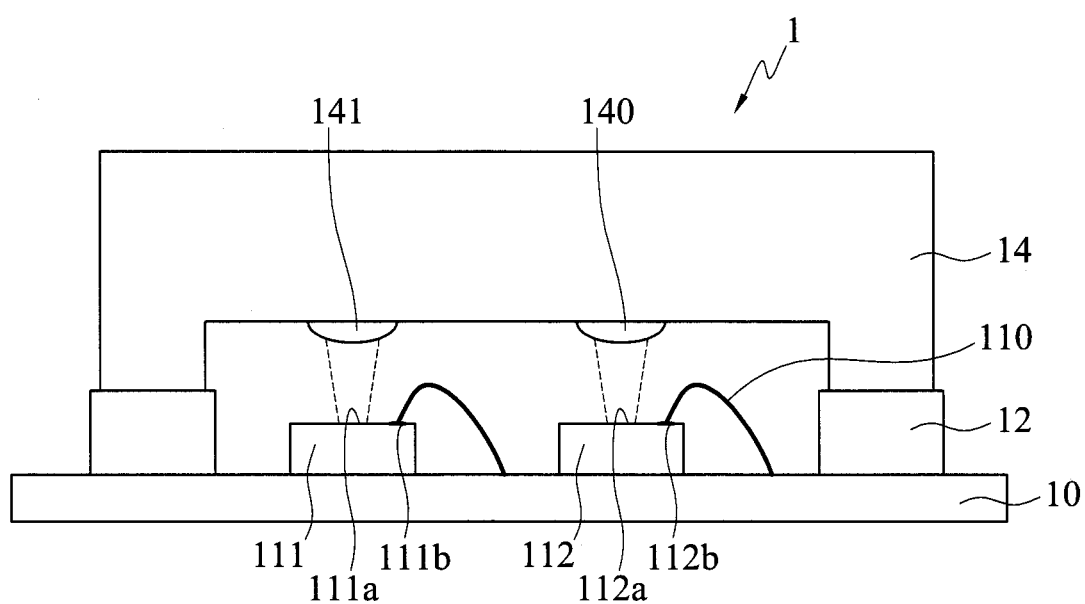
FIG. 1 is a schematic cross-sectional view of a conventional electro-optical module.
Figure 2A:
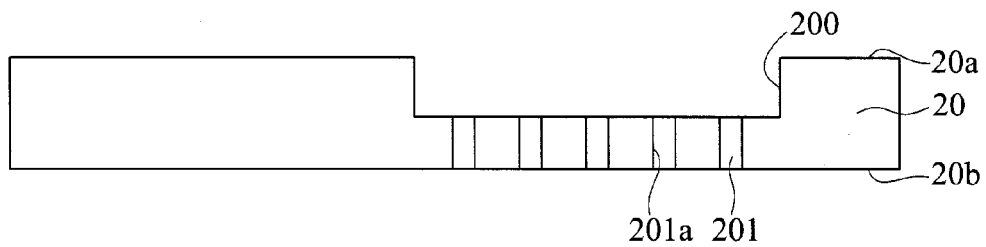
FIGS. 2A to 2C are schematic cross-sectional views illustrating an electro-optical module and a fabrication method thereof according to an embodiment the present invention, wherein FIG. 2A' illustrates another embodiment of FIG. 2A.
Figure 2A:
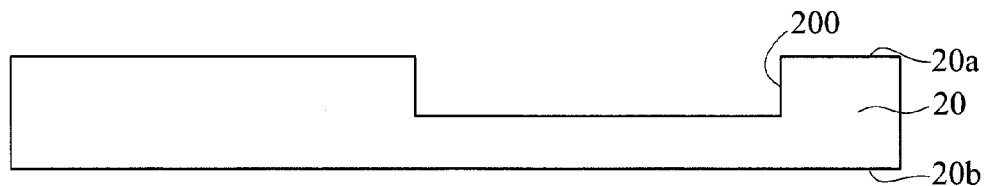
Figure 2B:
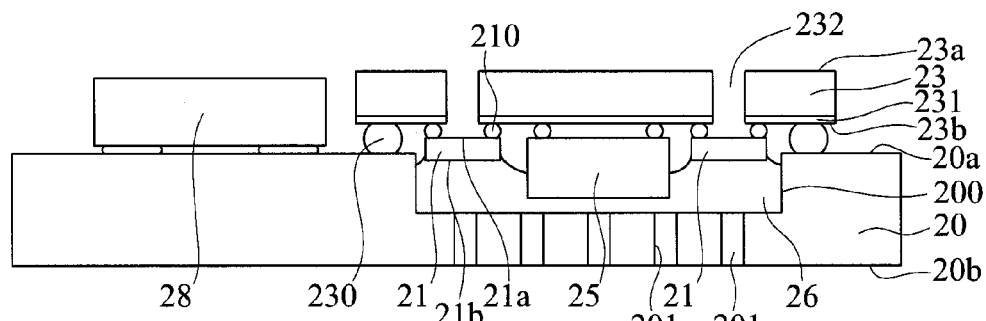
Figure 2C:
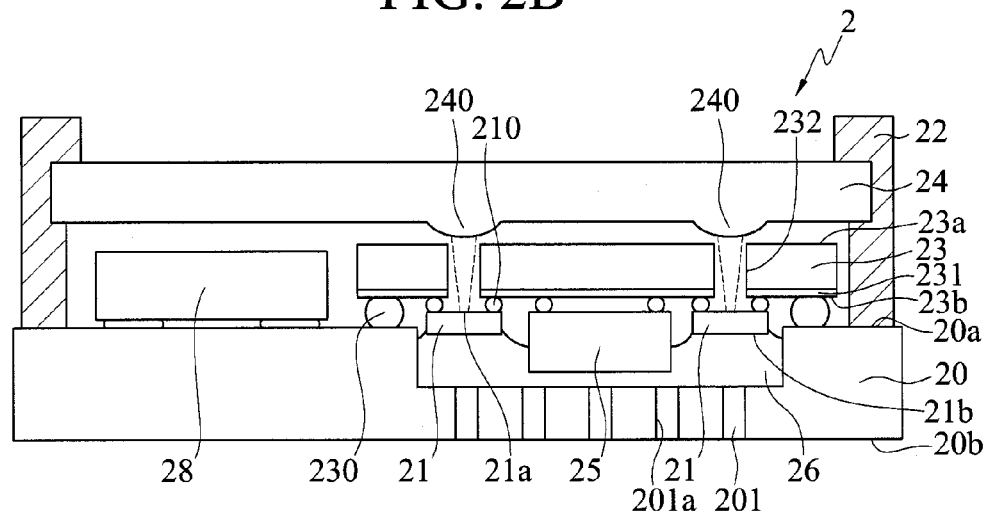

FIGS. 2A to 2C are schematic cross-sectional views illustrating an electro-optical module 2 and a fabrication method thereof according to an embodiment of the present invention. Therein, FIG. 2A' illustrates another embodiment of FIG. 2A.

Referring to FIG. 2A, a substrate 20 having a first surface 20a with a groove 200 and a second surface 20b opposite the first surface 20a is provided. A plurality of thermally conductive through holes 201 are formed in the groove 200 and penetrate the substrate 20, and a metal layer (not shown) is formed on an inner side of each of the thermally conductive through holes 201. In another embodiment, referring to FIG. 2A', no thermally conductive through holes are formed in the groove 200 of the substrate 20.

The groove 200 and the thermally conductive through holes 201 can be formed by cutting, etching, plasma or laser processing.

Referring to FIG. 2B, continued from FIG. 2A, an interposer 23 is disposed on and electrically connected to the first surface 20a of the substrate 20. The interposer 23 has opposite third and fourth surfaces 23a, 23b, and the fourth surface 23b faces the first surface 20a of the substrate 20. At least an electro-optical element 21 and a semiconductor chip 25 are disposed on and electrically connected to the fourth surface 23b of the interposer 23. Further, the electro-optical element 21 and the semiconductor chip 25 are disposed in the groove 200 of the substrate 20. The electro-optical element 21 has opposite active and non-active surfaces 21a, 21b and the electro-optical element 21 is electrically connected to the fourth surface 23b of the interposer 23 via the active surface 21a thereof.

Further, the fourth surface 23b of the interposer 23 has an electrical trace layer 231 formed thereon. In addition, the interposer 23 has a through hole 232 corresponding in position to the active surface 21a of the electro-optical element 21. Preferably, the through hole 232 has a diameter of 160 um.

In the present embodiment, a thermally conductive adhesive layer 26 is formed in the groove 200 for fixing the electro-optical element 21 and the semiconductor chip 25 in the groove 200 of the substrate 20. The thermally conductive adhesive layer 26 can be made of thermal grease. The electro-optical element 21 can be, but not limited to, a VCSEL diode, a photo diode (PD) or a light emitting diode (LED). The semiconductor chip 25 can be, but not limited to, a transimpedance amplifier (TIA), a laser diode driver (LDD), or a transimpedance amplifier having a laser diode driver and a power IC driver. Further, the number of the semiconductor chip 25 can be more than one. Furthermore, a microcontroller 28 is disposed on and electrically connected to the first surface 20a of the substrate 20 for controlling the electro-optical element 21 and the semiconductor chip 25.

In the present embodiment, the electro-optical element 21 and the semiconductor chip 25 are disposed on and electrically connected to the interposer 23 through a plurality of second conductive bumps 210, and the interposer 23 is electrically connected to the substrate 20 through a plurality of first conductive bumps 230. There is no special limitation on the order of disposing and electrically connecting the electro-optical element 21 to the interposer 23 and electrically connecting the interposer 23 to the substrate 20.

Referring to FIG. 2C, a plurality of support members 22 are disposed on the first surface 20a of the substrate 20, and a transparent plate 24 is disposed over the first surface 20a of the substrate 20 through the support members 22. The transparent plate 24 has a lens portion 240 corresponding in position to the active surface 21a of the electro-optical element 21. The support members 22 are located at an outer periphery of the groove 200.

In the present embodiment, the support members 22 are shield plates, which can be made of nickel-plated copper or any other metal material for achieving an EMI shielding effect.

The interposer 23 is a silicon interposer having high planarity and has an electrical trace layer 231 formed thereon with high precision, which facilitates to form high-precision electrical connections between the electro-optical element 21 and the interposer 23 and between the interposer 23 and the first surface 20a of the substrate 20 and improves the accuracy of alignment between the lens portion 240 of the transparent plate 24 and the electro-optical element 21.

Figure 6:
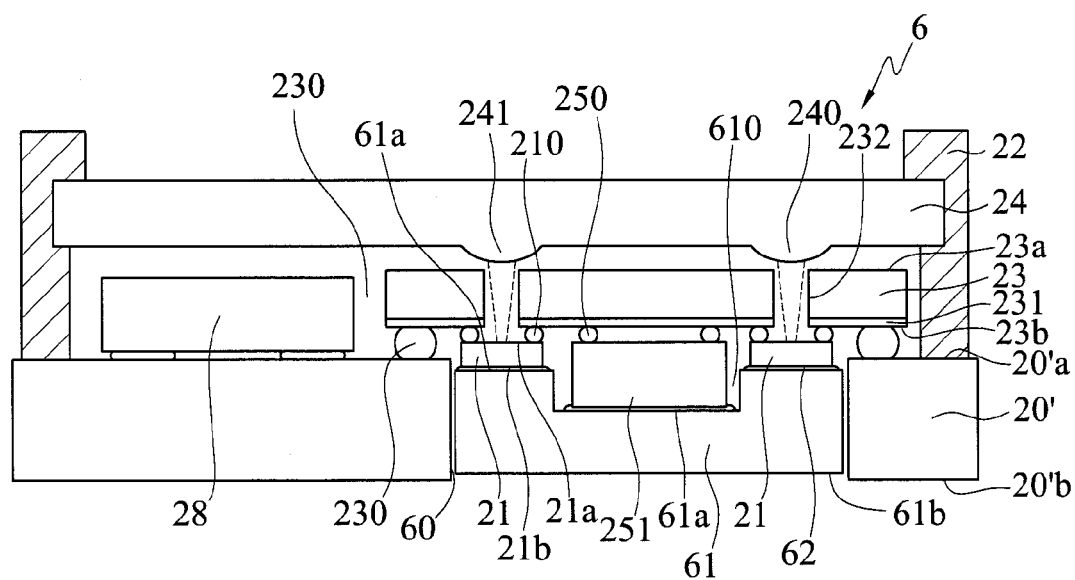
FIG. 6 is a schematic cross-sectional view of an electro-optical module according to a further embodiment of the present invention.

FIG. 6 is a schematic cross-sectional view of an electro-optical module 6 according to another embodiment of the present invention. Referring to FIG. 6, the electro-optical module 6 has: a substrate 20' having opposite first and second surfaces 20'a, 20'b and a cavity 60 penetrating the first and second surfaces 20'a, 20'b; a heat sink 61 having opposite top and bottom surfaces 61a, 61b and disposed in the cavity 60 in a manner that the bottom surface 61b is exposed from the second surface 20'b of the substrate 20'; a plurality of support members 22 disposed on the first surface 20'a of the substrate 20'; at least an electro-optical element 21 and a semiconductor chip 25 disposed on the top surface 61a of the heat sink 61, wherein the electro-optical element 21 has opposite active and non-active surfaces 21a, 21b and is disposed on the top surface 61a of the heat sink 61 via the non-active surface 21b thereof; a transparent plate 24 disposed over the first surface 20'a of the substrate 20' through the support members 22 and having a lens portion 240 corresponding in position to the active surface 21a of the electro-optical element 21; and an interposer 23 disposed on the first surface 20' a of the substrate 20' and between the electro-optical element 21 and the transparent plate 24 and electrically connected to the substrate 20' and the electro-optical element 21, wherein the interposer 23 has a through hole 232 corresponding in position to the lens portion 230 and the active surface 21a of the electro-optical element 21.

Further, the heat sink 61 is grounded through the substrate 20'. In addition, the interposer 23 can have a structure of FIGS. 3, 3', 4, 5. That is, the interposer 23 can have a metal layer 31, 41 or a soft materials layer 51 formed thereon.

Figure 3:
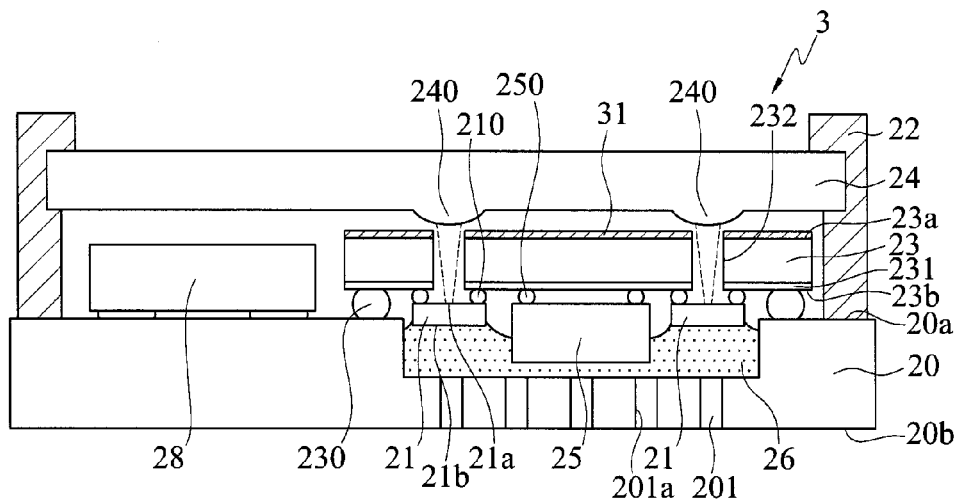
FIGS. 3 and 3' are schematic cross-sectional views of an electro-optical module according to another embodiment of the present invention.
Figure 3:
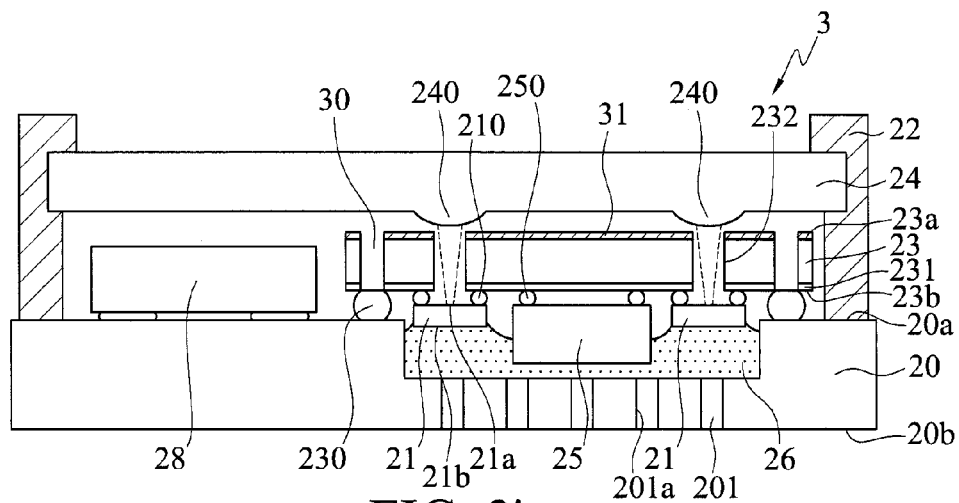

FIG. 3 illustrates an electro-optical module 3 according to another embodiment of the present invention. The present embodiment differs from the embodiment of FIG. 2C in that a metal layer 31 is formed on the third surface 23a of the interposer 23 of the electro-optical module 3. The metal layer 31 can be made of, but not limited to, Al, Cu, Au or Ti. The metal layer 31 improves the EMI shielding effect of the electro-optical module 3. Further, the through hole 232 can be plated with metal (not shown) such that the metal layer 31 is grounded to the substrate 20 through the through hole 232.

Alternatively, referring to FIG. 3', the interposer 23 further has a conductive via 30 penetrating the interposer 23 for electrically connecting the metal layer 31 to the substrate 20.

Figure 4:
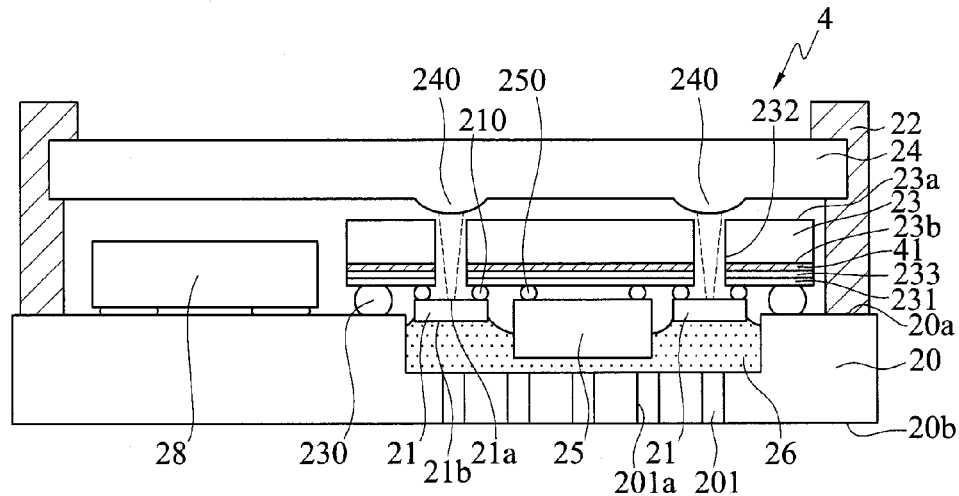
FIG. 4 is a schematic cross-sectional view of an electro-optical module according to a further embodiment of the present invention.

FIG. 4 illustrates an electro-optical module 4 according to another embodiment of the present invention. In the present embodiment, a metal layer 41 is formed on the fourth surface 23b of the interposer 23 and an insulating layer 233 and an electrical trace layer 231 are sequentially formed on the metal layer 41. The metal layer 41 along with the interposer 23 can be grounded to the substrate 20 through a portion of the electrical trace layer 231.

Figure 5:
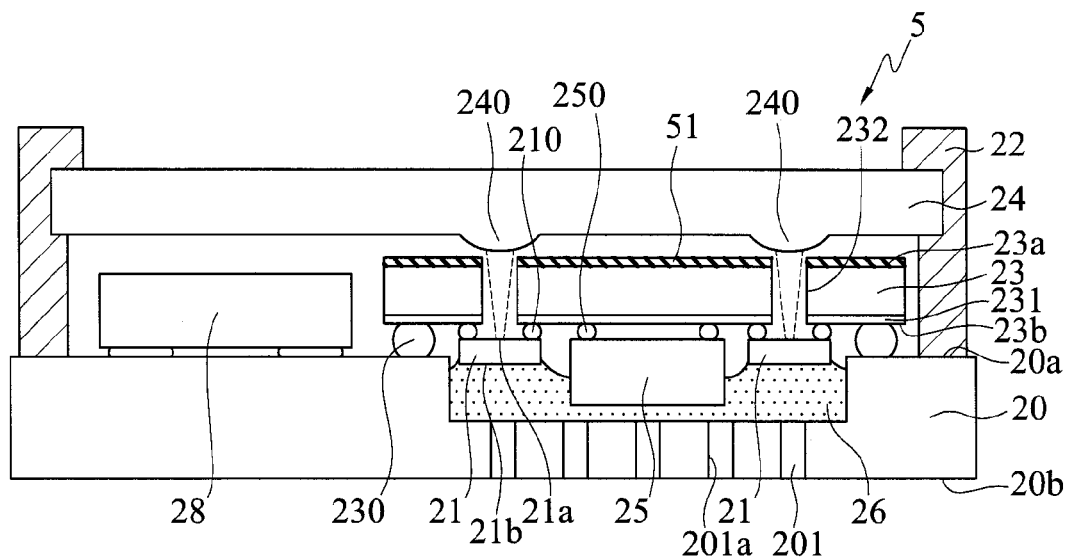
FIG. 5 is a schematic cross-sectional view of an electro-optical module according to still another embodiment of the present invention.

FIG. 5 illustrates an electro-optical module 5 according to another embodiment of the present invention. The present embodiment differs from the embodiment of FIG. 2C in that a soft material layer 51 is formed on the third surface 23a of the interposer 23. The soft layer 51 can be made of, but not limited to, a soft material such as polyimide (PI), benzocyclobutene (BCB) or polybenzoxazole (PBO). The soft material layer 51 enhances the mechanical strength of the interposer 23 as well as the electro-optical module 5.

The fabrication method of the electro-optical module 6 only differs from the processes of FIGS. 2A to 2C in that the cavity 60 instead of the groove 200 is formed in the substrate 20'. The cavity 60 can be formed by such as cutting, etching, plasma or laser processing.

Therefore, by electrically connecting the electro-optical element to the interposer in a flip-chip manner, the invention reduces signal losses during high frequency signal transmission and further reduces the size of the electro-optical module.

Furthermore, by fixing the transparent plate to the substrate through the support members, the invention improves the accuracy of alignment between the lens portion of the transparent plate and the electro-optical element on the substrate. In addition, the support members made of metal provide an EMI shielding effect so as to improve the quality of high frequency communication.

Moreover, by forming a plurality of thermally conductive through holes in the groove to penetrate the substrate or embedding a heat sink in the substrate, the invention allows heat generated by the electro-optical element and the semiconductor chip to be effectively dissipated out of the electro-optical module to achieve a preferred thermal dissipation effect.

Therefore, the invention overcomes the conventional disadvantage of signal losses caused by wire bonding, improves the accuracy of alignment and achieves preferred EMI shielding and thermal dissipation effects.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electro-optical module, comprising:
    a substrate having a first surface with a groove and a second surface opposite to the first surface;
    a plurality of support members disposed on the first surface of the substrate;
    at least an electro-optical element having opposite active and non-active surfaces and disposed in the groove of the substrate via the non-active surface thereof;
    an interposer disposed on the first surface of the substrate and the electro-optical element for electrically connecting the electro-optical element to the substrate, wherein the interposer has a through hole corresponding in position to the active surface of the electro-optical element; and
    a transparent plate disposed over the first surface of the substrate and the interposer through the support members and having a lens portion corresponding in position to the through hole of the interposer.

2. The module of claim 1, wherein the support members are located at an outer periphery of the groove.

3. The module of claim 1, further comprising a thermally conductive adhesive layer formed in the groove for fixing the electro-optical element in the groove of the substrate.

4. The module of claim 1, wherein the electro-optical element is a light-emitting element or a photo-detecting element.

5. The module of claim 1, further comprising a semiconductor chip disposed in the groove of the substrate and electrically connected to the interposer.

6. The module of claim 1, further comprising a microcontroller disposed on the first surface of the substrate.

7. The module of claim 1, wherein the support members are made of a metal.

8. The module of claim 1, wherein a plurality of thermally conductive through holes are formed in the groove and penetrating the substrate.

9. The module of claim 1, wherein the interposer has opposite third and fourth surfaces, the fourth surface faces the first surface of the substrate and the third surface has a metal layer formed thereon.

10. The module of claim 9, wherein a conductive via is formed to penetrate the interposer for electrically connecting the metal layer to the substrate.

11. The module of claim 1, wherein the interposer has opposite third and fourth surfaces, and the fourth surface faces the first surface of the substrate and has a metal layer, an insulating layer, and an electrical trace layer sequentially formed thereon.

12. The module of claim 1, wherein the interposer has opposite third and fourth surfaces, the fourth surface faces the first surface of the substrate and the third surface has a soft material layer formed thereon.

13. The module of claim 12, wherein the soft material layer is made of polyimide (PI), benzocyclobutene (BCB) or polybenzoxazole (PBO).

14. An electro-optical module, comprising:
   a substrate having opposite first and second surfaces and a cavity penetrating the first and second surfaces;
   a heat sink having opposite top and bottom surfaces and disposed in the cavity in a manner that the bottom surface of the heat sink is exposed from the second surface of the substrate;
   a plurality of support members disposed on the first surface of the substrate;
   at least an electro-optical element having opposite active and non-active surfaces and disposed on the top surface of the heat sink via the non-active surface thereof;
   an interposer disposed on the first surface of the substrate and the electro-optical element for electrically connecting the electro-optical element to the substrate, wherein the interposer has a through hole corresponding in position to the active surface of the electro-optical element; and
   a transparent plate disposed over the first surface of the substrate and the interposer through the support members and having a lens portion corresponding in position to the through hole of the interposer.

15. The module of claim 14, wherein the support members are located at an outer periphery of the cavity.

16. The module of claim 14, wherein the electro-optical element is a light-emitting element or a photo-detecting element, and is disposed on the top surface of the heat sink via a thermally conductive adhesive layer.

17. The module of claim 14, further comprising a semiconductor chip disposed in a concave portion on the top surface of the heat sink and electrically connected to the interposer.

18. The module of claim 14, further comprising a microcontroller disposed on the first surface of the substrate.

19. The module of claim 14, wherein the support members are made of a metal.

20. The module of claim 14, wherein the interposer has opposite fifth and sixth surfaces, and the fifth surface faces the first surface of the substrate and has a metal layer, an insulating, and an electrical trace layer sequentially formed thereon.

21. The module of claim 14, wherein the interposer has opposite fifth and sixth surfaces, the fifth surface faces the first surface of the substrate and the sixth surface has a metal layer formed thereon.

22. The module of claim 14, wherein the interposer has opposite fifth and sixth surfaces, the fifth surface faces the first surface of the substrate and the sixth surface has a soft material layer formed thereon.

23. The module of claim 22, wherein the soft material layer is made of polyimide (PI), benzocyclobutene (BCB) or polybenzoxazole (PBO).

* * * * *